(12) United States Patent
Wombacher

(10) Patent No.: US 7,645,636 B2
(45) Date of Patent: Jan. 12, 2010

(54) SEMICONDUCTOR DEVICE AND METHOD FOR PRODUCING IT, AND USE OF AN ELECTROSPINNING METHOD

(75) Inventor: Ralf Wombacher, Regensburg (DE)

(73) Assignee: Infineon Technologies AG, Munich (DE)

( * ) Notice: Subject to any disclaimer, the term of this patent is extended or adjusted under 35 U.S.C. 154(b) by 448 days.

(21) Appl. No.: 11/558,190

(22) Filed: Nov. 9, 2006

(65) Prior Publication Data

US 2007/0108637 A1 May 17, 2007

(30) Foreign Application Priority Data

Nov. 11, 2005 (DE) .................. 10 2005 054 267

(51) Int. Cl.
*H01L 21/56* (2006.01)
*H01L 23/31* (2006.01)

(52) U.S. Cl. .................. 438/118; 438/126; 257/703; 257/E21.503; 257/E23.127

(58) Field of Classification Search ............... 438/118, 438/126, 127; 257/703, 753, E21.503, E23.066, 257/E23.127

See application file for complete search history.

(56) References Cited

U.S. PATENT DOCUMENTS

| 2003/0137083 A1 | 7/2003 | Ko et al. |
| 2003/0195611 A1 | 10/2003 | Greenhalgh et al. |

FOREIGN PATENT DOCUMENTS

| DE | 10124047 | 11/2002 |
| WO | WO03/087443 | 10/2003 |
| WO | WO2005/026398 | 3/2005 |
| WO | WO2005/049707 | 6/2005 |

OTHER PUBLICATIONS

"Electrospinning of Polymeric and Ceramic Nanofiberg as Uniaxially Aligned Arrays", Dan Li, Yuliang Wang and Younan Xia, American Chemical Society, 2003.

*Primary Examiner*—David Vu
*Assistant Examiner*—Earl N Taylor
(74) *Attorney, Agent, or Firm*—Dicke, Billig & Czaja PLLC

(57) ABSTRACT

A semiconductor device and a method for producing it, and the use of the electrospinning method is disclosed. In one embodiment, delamination of the plastic housing composition from the circuit carrier can occur under loading, which can lead to the failure of the semiconductor device. For better adhesion, an adhesion-promoting layer having fibers applied by electrospinning is arranged between the circuit carrier and the plastic housing composition.

10 Claims, 4 Drawing Sheets

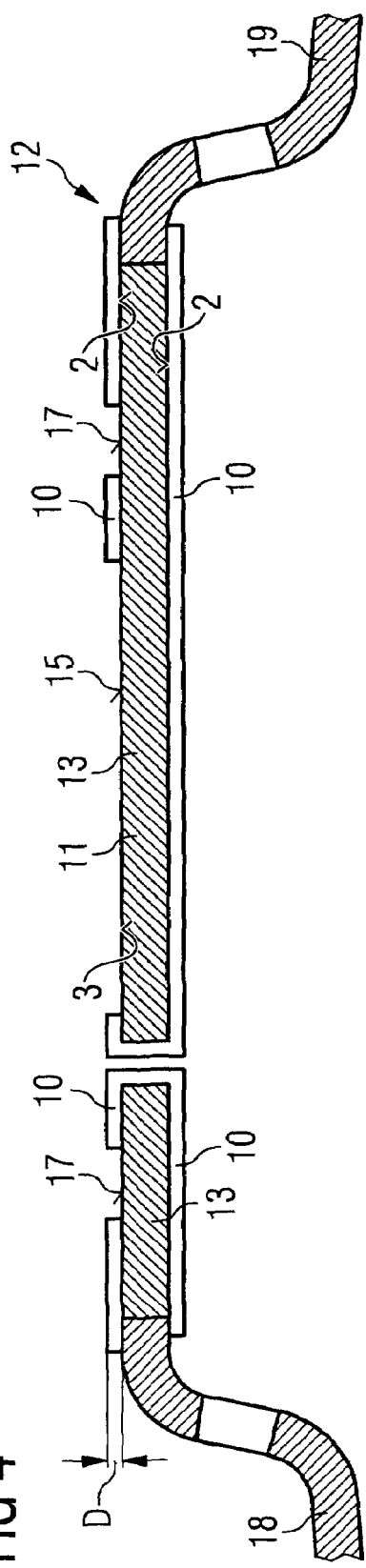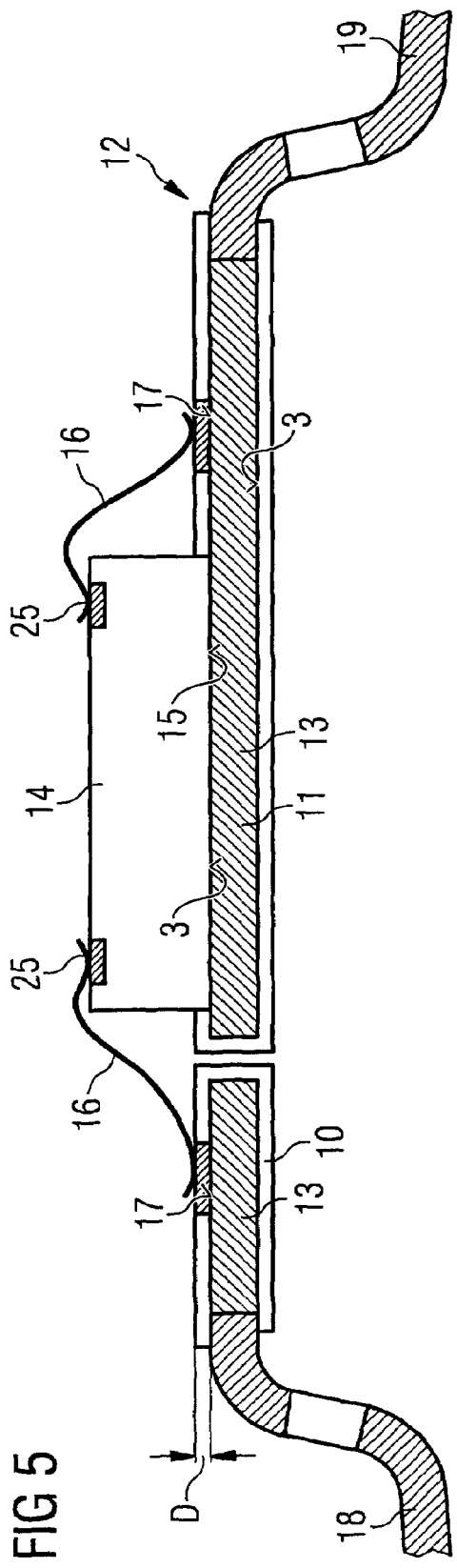

SEMICONDUCTOR DEVICE AND METHOD FOR PRODUCING IT, AND USE OF AN ELECTROSPINNING METHOD

CROSS-REFERENCE TO RELATED APPLICATIONS

This Utility patent application claims priority to German Patent Application No. DE 10 2005 054 267.0 filed on Nov. 11, 2005, which is incorporated herein by reference.

BACKGROUND

The invention relates to a semiconductor device and a method for producing it, and the use of an electrospinning method.

In semiconductor devices, delaminations of, for example, a plastic housing from the circuit carrier can occur under loading. Layers between interfaces of different components of the semiconductor devices are intended to contribute to improving the hitherto inadequate adhesion of plastic housing composition to the relevant surfaces and/or interfaces in semiconductor devices. Inadequate adhesions of this type lead to increased failure and constitute fault risks in semiconductor devices which can cause the devices to fail particularly in the context of device qualification.

The ingress of moisture into interfaces of this type is particularly hazardous, with the result that when a semiconductor device is soldered onto a superordinate circuit board, the "popcorn" effect can occur, which may involve semiconductor device components, in particular plastic housing parts, chipping off from the surface of the circuit carrier.

It has been attempted in some instances to roughen the surfaces of circuit carriers which form an interface with the plastic housing composition by means of mechanical preprocessing. It has also been attempted to apply a surface structure with undercuts by means of physico-chemical methods such as plasma etching or by means of a series of cascaded galvanic processes and in this way to achieve an improved interlinking of the interfaces of different components.

However, these previous adhesion-enhancing measures are comparatively complicated and do not yield a sufficient improvement in the molding composition adhesion. Moreover, devices with adhesively bonded chips cannot be treated by wet-chemical methods.

For these and other reasons, there is a need for the present invention.

SUMMARY

One embodiment provides a semiconductor device and a method for producing it, and the use of the electrospinning method. In one embodiment, delamination of the plastic housing composition from the circuit carrier can occur under loading, which can lead to the failure of the semiconductor device. For better adhesion, an adhesion-promoting layer having fibers applied by electrospinning is arranged between the circuit carrier and the plastic housing composition.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4 illustrates the schematic cross section of the circuit carrier in accordance with FIG. 2 after application of a layer according to the invention and after removal of the protective layer.

FIG. 5 illustrates a schematic cross section of the circuit carrier in accordance with FIG. 4 after application of contact pads and after fixing of a semiconductor chip and after connection of the contact areas of the semiconductor chip to the contact pads of the circuit carrier.

DETAILED DESCRIPTION

Figure 1:
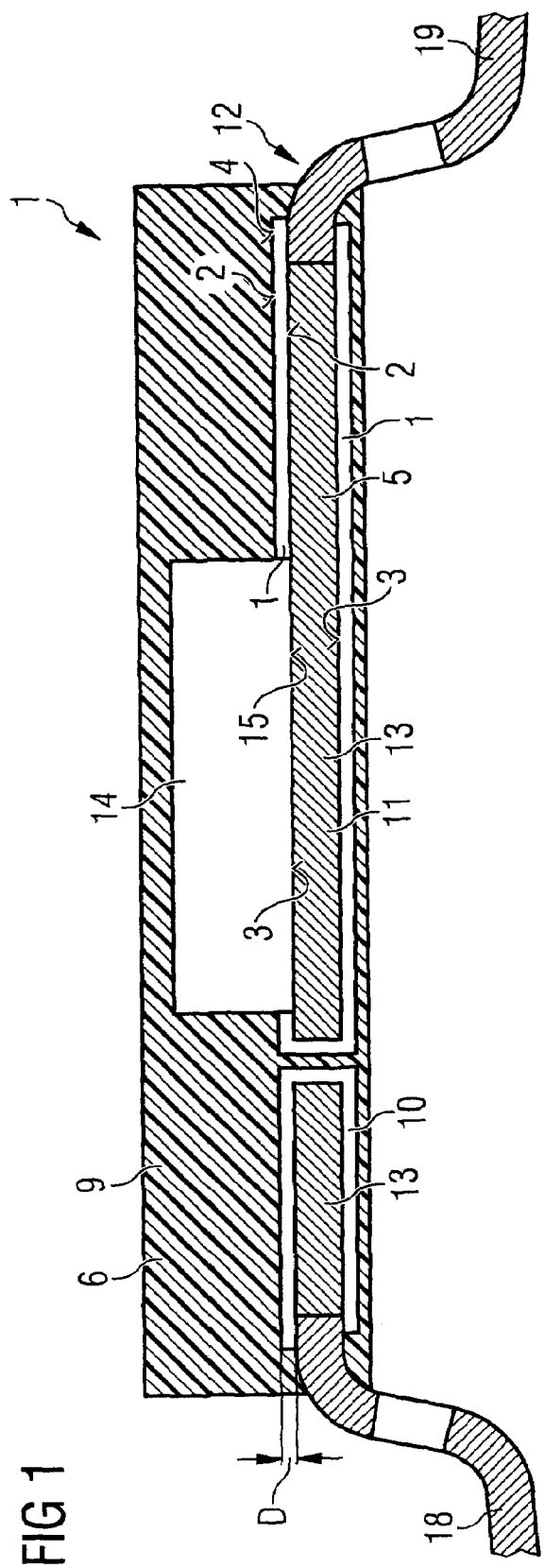
FIG. 1 illustrates a schematic cross section through a semiconductor device with a layer in accordance with a first embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the invention provides a layer which can be inserted between interfaces of different components in semiconductor devices and which reliably promotes an adhesion between the interfaces. A further embodiment of the present invention provides a simplest possible method for producing such a layer.

According to one embodiment of the present invention, in a semiconductor device having a circuit carrier and a plastic housing, a layer having fibers applied by means of electrospinning is arranged between circuit carrier and plastic housing.

In this case, the invention is based on the consideration that the interfaces should have strong undercuts for good adhesion promotion. The production of undercuts directly in the surfaces of the circuit carrier and of the plastic housing should be avoided, however, owing to the associated disadvantages—such as high technical outlay and restriction to chips that are not adhesively bonded in wet-chemical processes.

Instead, an adhesion-promoting layer should be provided between the interfaces. Fibers that are produced and applied by means of electrospinning are suitable for this. The fibers form a braiding and thus produce a surface structure with strong undercuts which brings about a good adhesion of the interfaces.

The semiconductor device according to the invention has the advantage that a reliable adhesion effect is achieved by means of the fiber braiding. Fibers produced by electrospinning can be produced as continuous fibers with different diameters of at least 10 nm and produce a dense braiding with strong undercuts on the support, in this case the circuit carrier. They are therefore particularly well suited as an adhesion promoter and thus reliably fix the plastic housing to the circuit carrier.

In one embodiment of the invention, the fibers include a ceramic material, and they have a diameter of between 10 nm and 5 μm. Such fibers can be fixed and firmly anchored particularly well on the circuit carrier by means of a sintering process. In addition, they produce undercuts on the surface of the circuit carrier whose relative sizes especially foster the adhesion-promoting effect.

The invention furthermore relates to a method for producing a layer between interfaces of different components in semiconductor devices, which firstly involves producing a circuit carrier of a semiconductor device with surfaces which carry a semiconductor chip and interfaces which are encapsulated with a plastic housing composition. In a second process, a layer composed of fibers is selectively applied to the interfaces of the circuit carrier with the aid of an electrospinning method.

In the electrospinning method, a drop of a liquid or gel is electrically charged at a nozzle. Through application of a high voltage, a jet is ripped out from the drop, accelerated to the counterelectrode and spun to form a thin fiber in this way.

In one embodiment of the invention, the fibers are produced from a ceramic precursor and cured in a subsequent thermal process. In this case, the fibers fixedly sinter on the interfaces of the circuit carrier and simultaneously form a stable, firmly anchored braiding with strong undercuts.

The ceramic precursor is produced using the sol-gel method, in which, in a wet-chemical low-temperature process, firstly a sol, i.e. a stable suspension of extremely fine particles in a liquid, is prepared and subsequently thickened in hydrolysis and condensation reactions. The sol is particularly well suited to processing by means of electrospinning.

An apparatus having a supply container for the starting material, for example the sol, a nozzle, a high-voltage source and also a holding apparatus for the circuit carrier is provided for carrying out the method. The circuit carrier clamped into the holding apparatus becomes the counterelectrode through application of a high voltage and thus becomes the support for the fiber layer.

As an alternative to this, it is also possible for a counterelectrode to be arranged below the circuit carrier and to be electrically insulated from the latter. The desired acceleration of the drop in the direction of the circuit carrier and thus its elongation to form a fiber are effected in this case, too.

The deposition of the fibers on the circuit carrier can be influenced by the arrangement of the counterelectrode and the strength of the applied voltage: it is either possible to produce a relatively loose fiber braiding by choosing a comparatively low voltage and/or by means of a comparatively large distance between the counterelectrode and the circuit carrier; or it is possible to produce a denser fiber braiding pressed more strongly onto the circuit carrier by means of a comparatively high voltage and/or the use of the circuit carrier itself as counterelectrode. This possibility for flexible configuration of the fiber layer is a particular advantage of the electrospinning method.

A method for producing a semiconductor device provides, after the application of the fiber layer, in the next process the application of a semiconductor chip to the circuit carrier and the production of electrical connections between semiconductor chip and coating-free contact pads of the circuit carrier. As an alternative to this, however, it is also possible first to apply the semiconductor chip and to produce the electrical connections between semiconductor chip and contact pads of the circuit carrier before the fiber layer is applied. The semiconductor chip and also, if appropriate, the electrical connections are likewise coated in this case.

Afterward, the semiconductor chip and the electrical connections are embedded into a plastic housing composition and the interfaces of the circuit carrier which are provided with the adhesion-promoting layer are likewise coated with the plastic housing composition. In this case, the embedding into the plastic housing composition is effected using injection-molding technology.

The use of an electrospinning method enables an adhesion-promoting layer to be applied to the circuit carrier with comparatively little technical outlay without the use of wet-chemical methods, which layer, by virtue of its strong undercuts, permits a stable anchoring of the plastic housing composition. Since wet-chemical processes are dispensed with, the adhesion-promoting layer can be used for a multiplicity of semiconductor devices, for example also for those which have adhesively bonded chips.

This therefore results in a further attractive application for the electrospinning method.

The layer applied by means of electrospinning is used in semiconductor devices as an adhesion promoter between a circuit carrier and the plastic housing composition. In this case, it may be arranged on a rewiring substrate having surfaces of a plastic carrier material and/or of a ceramic carrier material and structured metallic surfaces of rewiring lines.

It may also be arranged on a leadframe, the leadframe having internal leads with metallic surfaces on which the layer is arranged.

FIG. 1 illustrates a schematic cross section through a semiconductor device 1 in accordance with a first embodiment of the invention. In this first embodiment of the invention, the semiconductor device 1 is built onto a circuit carrier 11 stamped from a leadframe 12.

The leadframe 12 has external leads 18 as external contacts 19 and internal leads 13 for the connection of a semiconductor chip 14. In this case, the internal leads 13 are held by a plastic housing composition 9 having a contact area 4 with respect to an interface 2 of the adhesion-enhancing layer 10. The internal leads 13 have surfaces 3 which are partly coated with the adhesion-enhancing layer 10.

The semiconductor chip 14 is carried by one of the internal leads 13 on a coating-free surface region 15 and is likewise embedded into the plastic housing composition 9. The surfaces of the semiconductor chip 14 have no adhesion-enhancing layer in this embodiment of the invention. However, the remaining surfaces 3 of the internal leads 13 are completely coated with the adhesion-enhancing layer 10. The layer 10 has fibers produced by means of electrospinning, which enable a mechanical anchoring of the plastic housing composition 9 on the circuit carrier 11.

Figure 2:
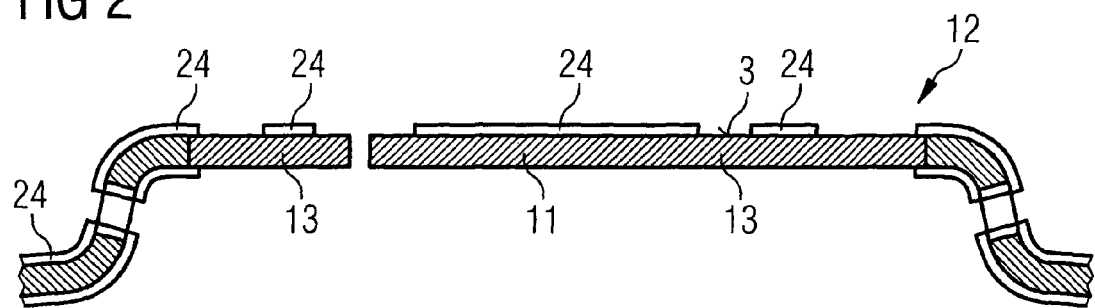
FIG. 2 illustrates a schematic cross section through a circuit carrier with a protective layer prior to coating by means of electrospinning.

Prior to the application of the layer 10, the circuit carrier 11 may be provided with a protective layer 24, as illustrated in FIG. 2, in regions in which coating by the electrospinning is not desired. The circuit carrier 11 is once again a segment of a leadframe 12 and has internal leads 13 whose surfaces 3 are in part free of protective layers 24 in order that the adhesion-enhancing layer according to the invention can be applied thereto. All surfaces 3 of the internal leads 13 that are kept free of the protective layer 24 can be coated in the electrospinning method illustrated in FIG. 3.

Figure 3:
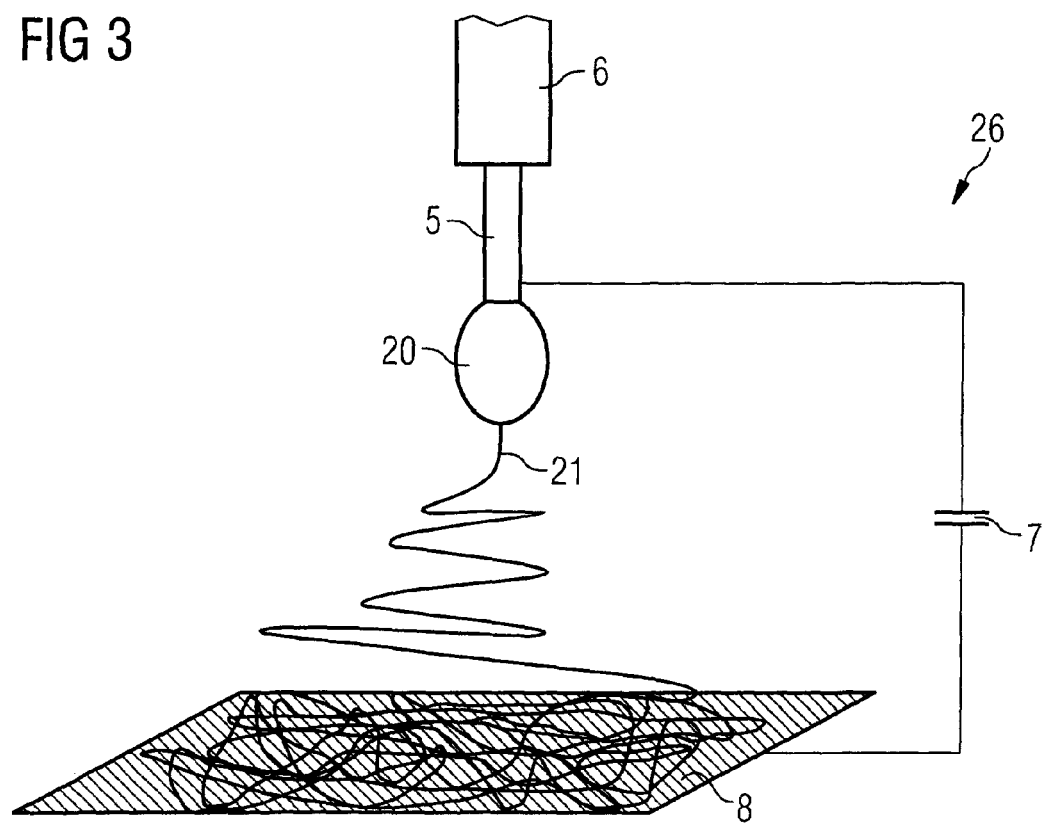
FIG. 3 schematically illustrates an apparatus for producing fibers according to the electrospinning method.

An apparatus 26 for carrying out the electrospinning method is illustrated schematically in FIG. 3. It includes a container 6, which stores the starting material for the fibers to be produced, and a nozzle 5, through which emerges the starting material, which may be for example a solution, a melt or a gel. A voltage is applied between the nozzle 5 and a support, which serves as counterelectrode 8, by means of the high-voltage source 7.

Via the nozzle 5, the starting material emerges as a drop 20 and is electrically charged. By means of the electric field, a fine jet 21 is ripped from the drop 20, accelerated to the counterelectrode 8 and stretched further and further in the process. The fibers produced in this way form a dense braiding on the support.

A ceramic precursor produced according to the sol-gel method is suitable, for example, as the starting material. Fibers made of a ceramic precursor are converted into a ceramic after the application of the layer 10 by means of a thermal process. In this case, the fibers fixedly sinter on the surface 3 of the internal lead 13 and form a densely interlinked, firmly anchored braiding with strong undercuts.

FIG. 4 illustrates the schematic cross section of the circuit carrier 11 in accordance with FIG. 2 after application of a layer 10 and after removal of the protective layer 24 as is illustrated in FIG. 2. In this case, the external leads 18 and the protected contact pads 17 on the internal leads are kept free of an adhesion-enhancing layer 10. In this method, the surface regions 15 of an internal lead 13 also remain free of an adhesion-enhancing layer 10 and can receive a semiconductor chip.

FIG. 5 illustrates the schematic cross section of the circuit carrier 11 in accordance with FIG. 4 after the optional application of a metallic coating to the contact pads 17 and after fixing of a semiconductor chip 14 on the internal lead 13 and after production of electrical connections 16 between contact areas 25 of the semiconductor chip 14 and the metallized contact pads 17.

Figure 6:
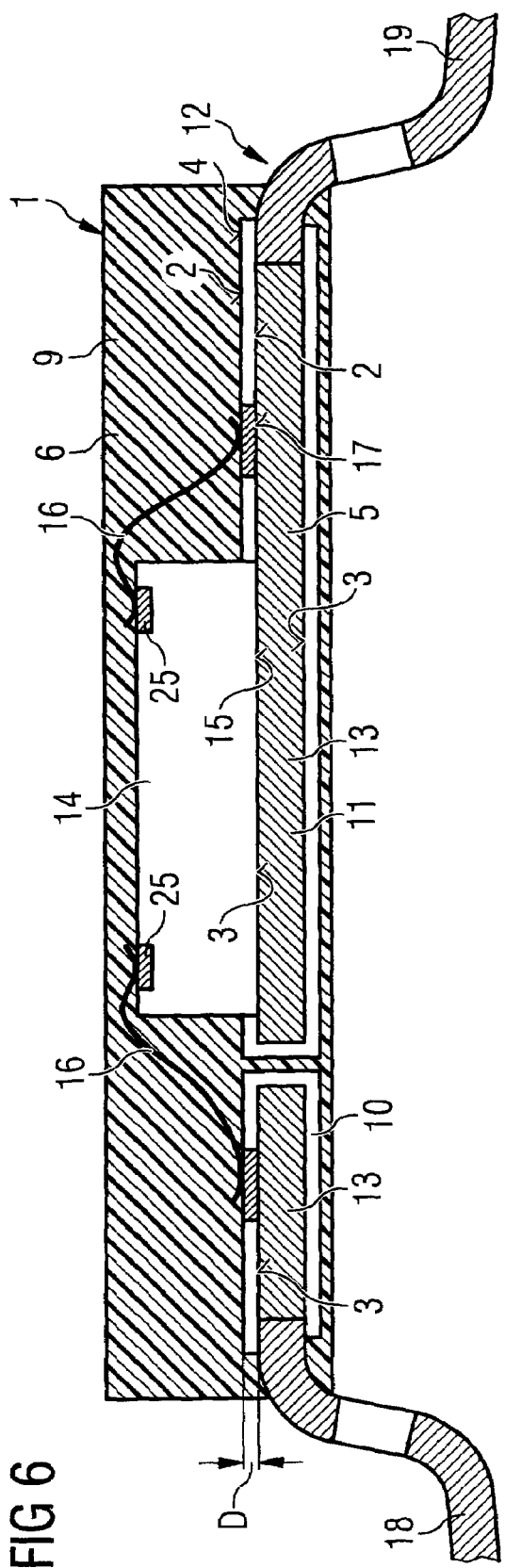
FIG. 6 illustrates the schematic cross section of a semiconductor device after application of a plastic housing composition to the circuit carrier.

FIG. 6 illustrates a schematic cross section through a semiconductor device 1 after application of a plastic housing composition 9 to the circuit carrier 11. In this case, the internal leads 13 are completely embedded into the plastic housing composition 9, if they do not carry a semiconductor chip 14, and in this case are simultaneously mechanically connected to the plastic housing composition 9. The plastic housing is firmly anchored by the pronounced undercuts in the layer 10.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a semiconductor device, the method comprising:
    producing a circuit carrier with surfaces which carry a semiconductor chip and with interface surfaces;
    applying a layer composed of fibers to the interface surfaces using an electrospinning method; and
    applying a plastic housing composition to at least the interface surfaces of the circuit carrier.

2. The method as claimed in claim 1, including producing the fibers from a ceramic precursor.

3. The method as claimed in claim 2, further comprising carrying out a curing process out after the application of the fibers.

4. The method as claimed in claim 2, including producing the ceramic precursor using a sol-gel method.

5. A method for producing a semiconductor device comprising:
    producing a circuit carrier with at least one surface for carrying a semiconductor chip and with interface surfaces;
    applying a layer composed of fibers to the interface surfaces using an electrospinning technique;
    applying a semiconductor chip to the at least one surface;
    producing of electrical connections between semiconductor chip and coating-free contact pads of the circuit carrier;
    embedding the semiconductor chip and the electrical connections into a plastic housing composition with simultaneous application of the plastic housing composition to the surfaces coated with the fiber layer.

6. A method for producing a semiconductor device comprising:
    producing a circuit carrier with surfaces for carrying a semiconductor chip and with interface surfaces;
    applying a semiconductor chip to corresponding surfaces of the circuit carrier;
    producing electrical connections between semiconductor chip and coating-free contact pads of the circuit carrier;
    applying a layer composed of fibers to the interface surfaces of the circuit carrier using an electrospinning process;

embedding the semiconductor chip, the electrical connections, and the interface surfaces of the circuit carrier coated with a layer of fibers in a plastic housing composition.

7. The method of claim 6, wherein embedding the semiconductor chip, the electrical connections, and the interface surfaces coated with the layer of fibers includes using injection-molding technology.

8. The method of claim 6, wherein the layer of fibers is an adhesion promoter between the circuit carrier and the plastic housing composition.

9. The method of claim 8, wherein the layer of fibers is arranged on a rewiring substrate as the circuit carrier, the rewiring substrate having surfaces of a plastic carrier material and/or of a ceramic carrier material and structured metallic surfaces of rewiring lines.

10. The method of claim 9, wherein the layer of fibers is arranged on a leadframe as the circuit carrier, the lead frame having internal leads with metallic surfaces on which the layer is arranged.

* * * * *